US006218726B1

(12) United States Patent
Chang et al.

(10) Patent No.: US 6,218,726 B1
(45) Date of Patent: Apr. 17, 2001

(54) BUILT-IN STRESS PATTERN ON IC DIES AND METHOD OF FORMING

(75) Inventors: Chung-Tao Chang; Chia-Chung Wang; Hsin-Chien Huang, all of Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/349,680

(22) Filed: Jul. 8, 1999

(51) Int. Cl.⁷ ...................... H01L 23/495; H01L 31/0328
(52) U.S. Cl. ........................... 257/672; 257/676; 257/203
(58) Field of Search .................................. 257/672, 676, 257/203, 207, 208

(56) References Cited

U.S. PATENT DOCUMENTS

| | | | |
|---|---|---|---|
| 5,585,282 | * | 12/1996 | Wood et al. . |
| 5,641,977 | * | 6/1997 | Kanamori . |
| 5,643,834 | * | 7/1997 | Harada et al. . |
| 5,931,222 | * | 8/1999 | Toy et al. . |
| 5,936,260 | * | 8/1999 | Corbett et al. . |
| 5,945,731 | * | 8/1999 | Iino . |
| 6,118,138 | * | 9/2000 | Farnworth et al. . |

* cited by examiner

Primary Examiner—Stephen D. Meier
(74) Attorney, Agent, or Firm—Tung & Associates

(57) ABSTRACT

An IC die formed with built-in stress test pattern and a method for forming such pattern are described. The stress test pattern may be formed by first forming a thermal oxide insulation layer on a silicon substrate, then forming a first plurality of diagonally positioned linear metal traces of a first metal, then depositing an electrically insulating material layer on top of the first plurality of diagonally positioned metal traces, and forming a second plurality of L-shaped metal bars of a second metal positioned with the two sides of L parallel to the two sides of a corner region and overlapping the first plurality of metal traces with the electrically insulating material layer therein between. The double metal method for forming the stress test pattern can be easily incorporated into the fabrication process for an IC die without any additional deposition or photolithographic steps. The metal 1 and metal 2 layers may be suitably formed of aluminum or an aluminum alloy, or any other conductive metallic material. The L-shaped metal bars formed by the metal 2 layer should intersect the linear metal traces at a 45° angle with an isolation layer therein between. An electrical resistance between the two metal layers can be determined by a leakage current therein between as a direct indication of the thermo-mechanical stresses, or shear stresses existing between the two metal layers. The present invention stress test pattern can be formed in any size or dimensions as long as one metal layer is formed in linear, diagonal strips while the other metal layer is formed in L-shaped metal bars overlapping the first metal layer.

11 Claims, 6 Drawing Sheets b: Width = 50um, Spacing = 30um
c: Width = 25um, Spacing = 55um
d: Width = 70um, Spacing = 10um

| Cycles | Fail Pcs | Fail Patterns |
|---|---|---|
| 100 | 1 | 1 |
| 200 | 1 | 2 |
| 300 | 2 | 3 |
| 400 | 3 | 4 |
| 500 | 4 | 6 |
| 600 | 5 | 7 |
| 700 | 5 | 12 |
| 800 | 5 | 14 |
| 900 | 5 | 10 |
| 1000 | 7 | 17 | b: Width = 50um, Spacing = 30um
c: Width = 25um, Spacing = 55um
d: Width = 70um, Spacing = 10um

| Cycles | Fail Pcs | Fail Patterns |
|---|---|---|
| 100 | 2 | 3 |
| 200 | 4 | 7 |
| 300 | 4 | 9 |
| 400 | 5 | 11 |
| 500 | 5 | 13 |
| 600 | 8 | 21 |
| 700 | 8 | 20 |
| 800 | 7 | 22 |
| 900 | 8 | 26 |
| 1000 | 8 | 36 | b: Width = 50um, Spacing = 30um
c: Width = 25um, Spacing = 55um
d: Width = 70um, Spacing = 10um

| Cycles | Fail Pcs | Fail Patterns |
|---|---|---|
| 100 | 1 | 1 |
| 200 | 1 | 1 |
| 300 | 1 | 1 |
| 400 | 2 | 3 |
| 500 | 3 | 4 |
| 600 | 2 | 3 |
| 700 | 6 | 6 |
| 800 | 8 | 10 |
| 900 | 8 | 10 |
| 1000 | 7 | 16 | b: Width = 50um, Spacing = 30um
c: Width = 25um, Spacing = 55um
d: Width = 70um, Spacing = 10um

BUILT-IN STRESS PATTERN ON IC DIES AND METHOD OF FORMING

FIELD OF THE INVENTION

The present invention generally relates to an IC die formed with a built-in stress test pattern and a method for forming such pattern and more particularly, relates to built-in stress test patterns on IC dies that can be formed at corners of each die by a double metal method of utilizing metal 1 and metal 2 layers with an isolation layer therein between and then encapsulating in a molding compound prior to subjecting the dies to a thermal cycling test and a method for forming such stress test patterns.

BACKGROUND OF THE INVENTION

In the fabrication of IC devices, a frequently seen mode of failure results form stress and strain in the bulk material used in forming the device. The stress and strain in the bulk material may be caused by the internal forces due to dislocations, excess vacancies and impurities in the material, growth around trapped foreign material, thermal gradients during processing, and changes in temperature after dissimilar materials are bonded together. For instance, vapor-deposited material of either an amorphous type, a polycrystalline type or a single-crystal type develops large internal stresses during the deposition process.

The stress and strain problem frequently occurs in the thin films formed of dissimilar materials on top of a silicon wafer. These dissimilar materials may be silicon, silicon oxide, metal conducting layers, passivation dielectric layers and polymeric based molding materials used in the encapsulation process. The structural built-up of wafers normally involves semiconductor-dielectricmetal sandwiching layers that are particularly susceptible to differential expansion-induced stress because of the large disparity between the thermal expansion coefficients of the various materials. In addition, the various films of different materials may have internal stresses built-in during the deposition process which may further increase the thermally-induced stress.

To determine the magnitude and the detrimental effect of the differential expansion-induced stress in an IC device, therefore, becomes an important task in the quality control or reliability determination of device fabricated. The type of reliability problems that are frequently seen in molded plastic packages of IC devices frequently involves cracking in the layers of thin films deposited on the silicon surface. A hot/cold thermal cycle test is one method used in reliability testing for determination of the differential expansion-induced stress, also known as thermo-mechanical stress resulting from disparity of expansion coefficience of the material layers which causes large relative displacements at the various material interfaces.

In an IC device that is formed with dies of substantially square dimensions, it has been noticed that the differential expansion-induced stress occurs most severely at the corner regions of the dies. The stress exists mostly in a form of shear stress between the material layers. The shear stress may severely affect the isolation between dielectric layer and metal layers and furthermore, the adhesion between a silicon oxide layer and a silicon surface thus presenting various reliability problems. Since most of the materials used in forming the metal layers, the dielectric layers and the isolation layers are fixed and cannot be changed, the selection of a plastic molding compound for encapsulating the IC package becomes an important factor. The selection of the molding compound must be carefully conducted such that the differential expansion-induced stress caused by a disparity of expansion coefficient between the molding compound and the various material layers must be minimized. It is therefore desirable to have an IC test die that can be formed with built-in stress test patterns for evaluating the undesirable effect of the different expansion coefficient between the materials.

It is therefore an object of the present invention to provide an IC die that is formed with built-in stress test pattern that does not have the drawbacks or shortcomings of the conventional test methods for molded-in stresses on IC packages.

It is another object of the present invention to provide an IC die that is formed with built-in stress test pattern that can be easily fabricated during the IC die fabrication process.

It is a further object of the present invention to provide an IC die that is formed with built-in stress test pattern without requiring additional fabrication steps than those normally required for forming the die.

It is another further object of the present invention to provide an IC die that is formed with built-in stress test pattern at corner regions of the die.

It is still another object of the present invention to provide an IC die that is formed with built-in stress test pattern that includes at least two stress patterns each formed at one of the four corner regions.

It is yet another object of the present invention to provide an IC die that is formed with at least two stress test patterns wherein each of the patterns is formed with a dielectric layer on the silicon substrate, a first metal layer, an electrically insulating material layer, and a second metal layer on top while the die is encapsulated in a molding compound.

It is still another further object of the present invention to provide a method for testing thermo-mechanical stresses in a plastic package of an IC die by first providing an IC die with built-in test patterns formed at least two of the corner regions, encapsulating the die in a molding compound, thermal cycling the package through a plurality of thermal cycles, and probing between the first and second plurality of metal traces in the test pattern to determine leakage currents and thermo-mechanical stresses.

It is yet another further object of the present invention to provide a method for testing thermo-mechanical stresses in a plastic package of an IC die by first forming built-in stress test patterns at a comer region which consists of a first metal layer formed in linear metal traces and a second metal layer formed in L-shaped metal bars on top of the first metal layer with an electrically insulating layer therein between.

SUMMARY OF THE INVENTION

In accordance with the present invention, an IC die that is formed with built-in stress test pattern and a method for performing thermo-mechanical stress testing on a plastic package of an IC die are provided.

In a preferred embodiment, an IC die formed with built-in stress test pattern is provided which includes a silicon substrate that has four corner regions, and at least two stress test patterns each formed at one of the four corner regions, the at least two stress test patterns each includes a dielectric material layer on the silicon substrate, a first plurality of diagonally positioned linear metal traces formed of a first metal, an electrically insulating material layer on top of the first plurality of diagonally positioned metal traces, and a second plurality of L-shaped metal bars formed of a second metal positioned with the two sides of L parallel to the two sides of a corner region and overlapping the first plurality of metal traces with the electrically insulating material layer therein between.

In the IC die formed with built-in stress test pattern, each of the second plurality of L-shaped metal bars being electrically connected to a contact pad adapted for contact probing. The at least two stress test patterns may include three stress test patterns formed at three of the four corner regions. The IC die may further include alignment marks formed at a fourth corner region, the IC die may be one of a multiplicity of dies formed on a silicon wafer. The second plurality of L-shaped metal bars may include between about two and about ten metal bars.

In the IC die formed with built-in stress test pattern, the second plurality of L-shaped metal bars may include preferably between about three and about five metal bars. The second plurality of L-shaped metal bars may be arranged parallel to each other. The second plurality of L-shaped metal bars overlaps the first plurality of linear metal traces in such a way that the two sides of L each intersects the linear metal traces at 45° angle as viewed from the top of the IC die. The first metal and the second metal may be formed of aluminum or aluminum alloy. The die may further include a molding compound on top of the IC die encapsulating the second plurality of L-shaped metal bars.

The present invention is further directed to a method for testing thermo-mechanical stresses in a plastic package of an IC die including the steps of providing an IC die that has a silicon substrate with four corner regions, and at least two stress test patterns each formed at one of the four corner regions, the at least two stress test patterns each includes a dielectric material layer on the silicon substrate, a first plurality of diagonally positioned linear metal traces formed of a first metal, an electrically insulating material layer on top of the first plurality of diagonally positioned metal traces, and a second plurality of L-shaped metal bars formed of a second metal positioned with the two sides of L parallel to the two sides of a corner region and overlapping the first plurality of metal traces with the electrically insulating material layer therein between, encapsulating the IC die in a molding compound forming an IC package, thermal cycling the IC package through at least ten thermal cycles, and probing between the first plurality and the second plurality of metal traces and bars and measuring electrical currents for determining the thermo-mechanical stresses.

In a method for testing thermo-mechanical stresses in a plastic package of an IC die, the method may further include the step of encapsulating the IC die in a polymeric based molding compound. The method may further include the step of electrically connecting the second plurality of L-shaped metal bars to contact pads adapted for contact probing. The method may further include the step of forming three stress test patterns at three of the four corner regions and an alignment mark at a fourth corner region. The method may further include the step of forming the first plurality of linear metal traces and the second plurality of L-shaped metal bars in aluminum or aluminum alloy, or the step of forming the first plurality of linear metal traces and the second plurality of L-shaped metal bars in a thickness between about 0.5 μm and about 10 μm. The method may further include the step of thermal cycling the IC package in a plurality of hot/cold cycles between temperatures of about −55° C. and about 150° C. The plurality of hot/cold cycles may be at least ten cycles, or may be between about 10 cycles and about 1,000 cycles.

BRIEF DESCRIPTION OF THE DRAWINGS

These objects, features and advantages will become apparent by an examination of the following specification and the appended drawings in which:

FIG. 4 is an enlarged, cross-sectional view of a stress test pattern of the present invention illustrating the metal 1 and the metal 2 layers with an insulating layer therein between.

DETAILED DESCRIPTION OF THE PREFERRED EMBODIMENT

Figure 1:
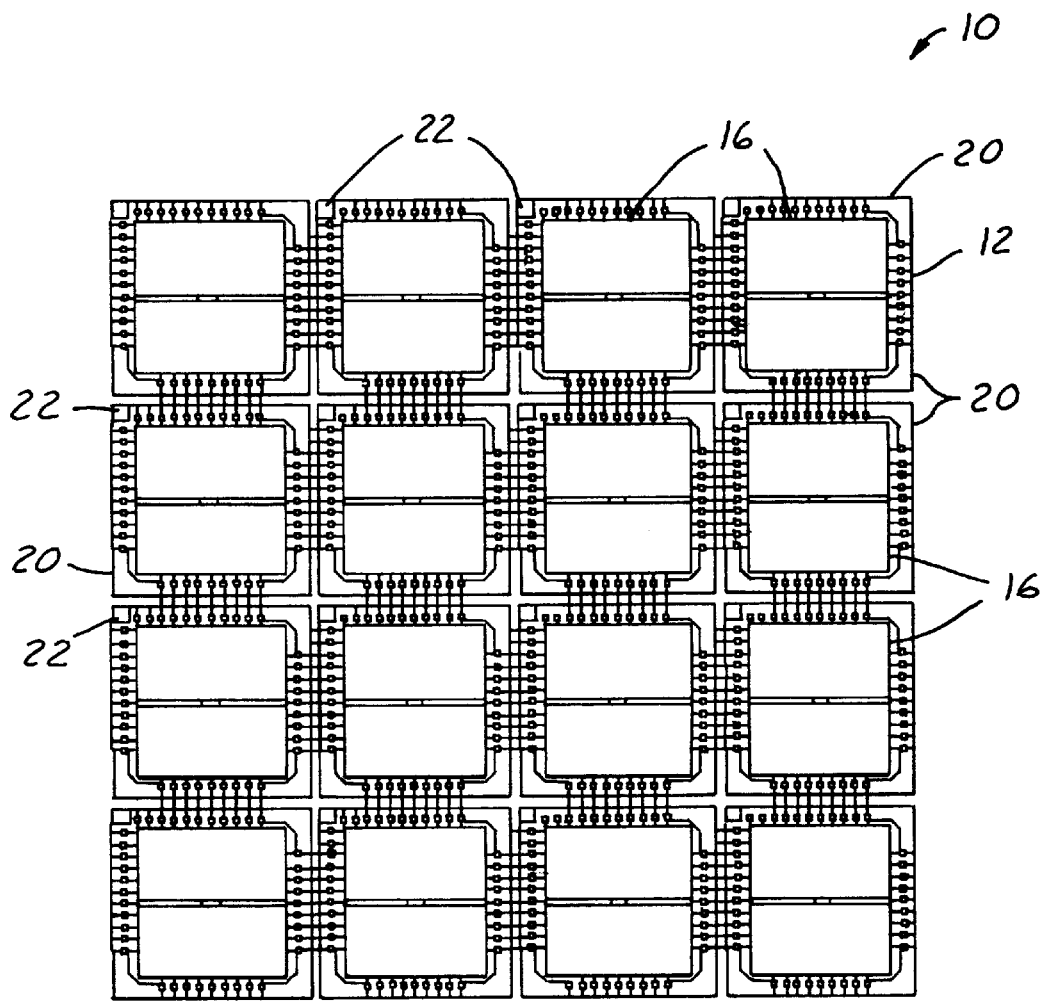
FIG. 1 is a plane view of a plurality of IC dies on a silicon substrate wherein each of the dies is equipped with the present invention built-in stress test pattern.

The present invention discloses an IC die that is formed with built-in stress test pattern and a method for forming such stress test pattern at least two of the four corners of an IC die. The stress test pattern is essentially formed by first depositing a dielectric material layer on a silicon substrate, then forming a first plurality of diagonally positioned linear metal traces of a first metallic material, then depositing an electrically insulating material layer on top of the first plurality of diagonally positioned metal traces, and forming a second plurality of L-shaped metal bars of a second metallic material positioned with the two sides of L parallel to the two sides of a corner region and overlapping the first plurality of metal traces with the electrically insulating material layer therein between.

The present invention built-in stress test pattern formed on IC dies can be used to evaluate the various processing conditions and materials utilized in forming the dies and more particularly, to evaluate a new molding compound used in forming the IC package or a new molding process utilized in forming the package. In the stress test pattern of the present invention, each of the second plurality of L-shaped metal bars and each of the first plurality of metal traces are electrically connected to a contact pad adapted for contact probing such that a current, or lack thereof, flowing between the metal bar and the metal trace can be determined. The present invention novel stress test pattern is formed by a double metal approach of utilizing a metal 1 and a metal 2 layer insulated therein between by an isolation layer for predicting thermo-mechanical stresses between the various material layers in the device, or between the wire bonds and the encapsulating material after the IC die is molded in a molding compound forming an IC package. The double metal stress pattern is formed most suitably at a corner, or in a corner region since the corner regions are where most thermo-mechanical stresses are concentrated after a molding or a packaging process. The metal 1 and metal 2 layer are deposited by normal fabrication processes utilized in forming the IC device and therefore, no additional masking or photolithographic process is required. The metal layers are first deposited by a typical metal deposition step, such as by a sputtering process, and then etched to form the specific patterns. For instance, for the metal 1 layer, an aluminum layer or an aluminum alloy layer is first deposited and then etched into diagonally positioned linear metal traces at a corner region of the IC die. Similarly, the metal 2 layer may be deposited of a conductive metal and then etched into L-shaped metal bars on top of an isolating layer deposited between the metal 1 layer and the metal 2 layer.

The thermo-mechanical stresses, i.e., normally of a shear nature, may be measured between the two metal layers by contact pads which are connected to the two layers, respectively. Normally, in a stress-free condition, the electrical resistance between the two metal layers is high enough such that no current can be measured between the two contact pads that are connected to the two metal layers. However, when a large thermal stress exists between the two layers, a leakage current can be measured between the contact pads. The magnitude of the leakage current is a direct indication of the magnitude of thermal stresses existing and therefore, can be used to predict the level of stresses by an established empirical relationship. The thermo-mechanical stresses are therefore measured as a magnitude of electrical resistance between the layers which is indirectly expressed in electrical current measured flowing between the two metal layers.

The present invention novel stress test pattern that is built-in on IC dies and the method for forming the novel stress test pattern can therefore be advantageously used for testing different types of molding compounds used in molding IC packages. Any adverse effect of the IC package, i.e. effect on the wire bonding or possible breaking of the wire bonds, can therefore be predicted for an IC package after a plastic molding process. The magnitude of the thermal stresses measured is a direct indication of the likelihood of any failure of the wire bonds in the IC structure or if other possible cracks or dislocations occurring between the various material layers. The present invention novel stress test pattern therefore is a more reliable method for such evaluation when compared to a conventional method of computer simulation.

Referring initially to FIG. 1, wherein a present invention chip array 10 is shown. The chip array 10 is formed on a silicon substrate 12 with a plurality of IC dies 16. The chip array 10 may be formed on any size of silicon wafers, i.e. a 6 inch wafer, an 8 inch wafer or a 12 inch wafer. Each of the IC dies 16 is equipped with three built-in stress test patterns 20 formed at three of the four corner regions of the IC dies 16. The fourth corner of each of the IC dies 16 is formed with alignment marks 22. It should be noted that the number of stress test patterns required on each IC die 16 is optional and frequently, either two or three test patterns 20 is utilized while the other corner regions may be provided with alignment marks 22. The IC dies 16, when forming a stress test die, is normally a dummy die that does not contain IC circuits.

Figure 2:
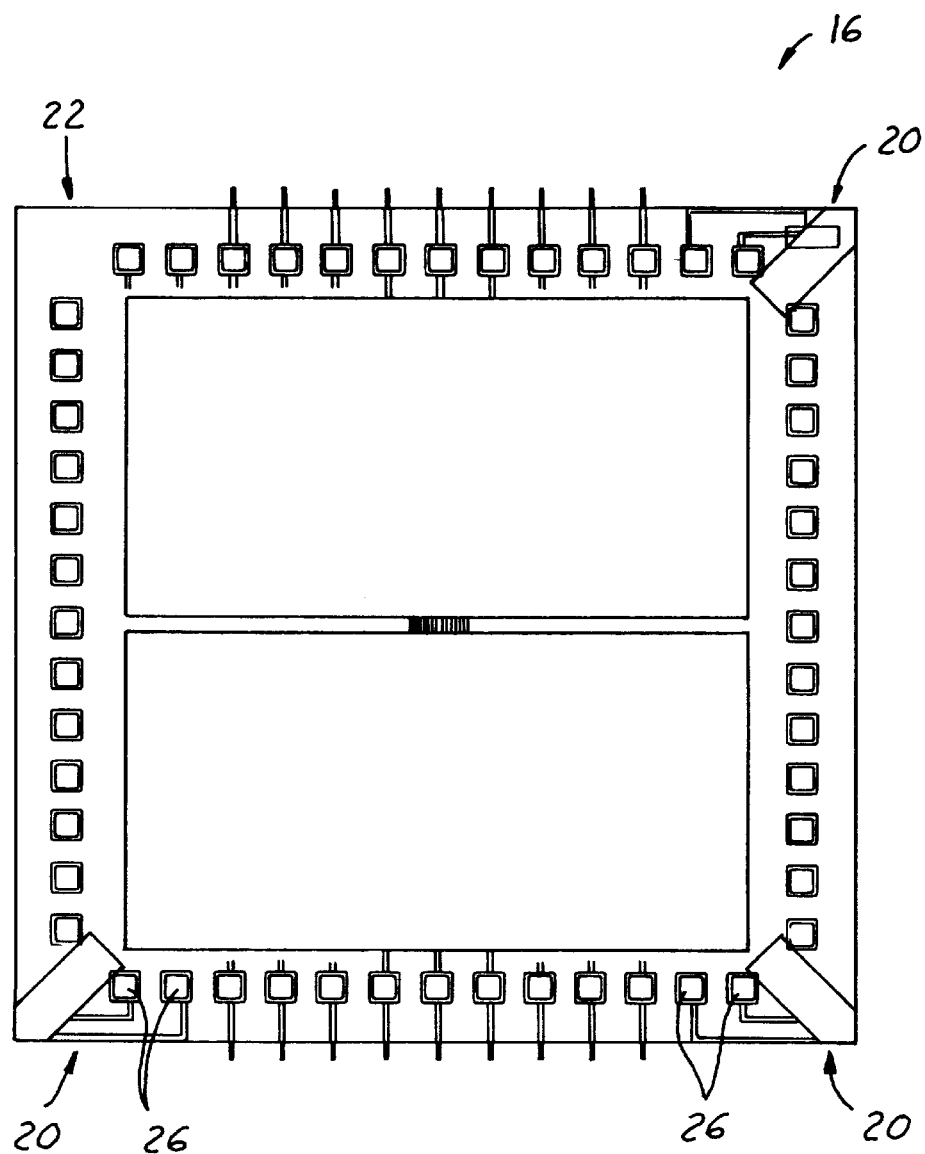
FIG. 2 is an enlarged, plane view of a single IC die equipped with three stress test patterns formed at three of the four corners of the die.

An enlarged, plane view of an IC die 16 is shown in FIG. 2. In the IC die 16 shown in FIG. 2, three stress test patterns 20 are provided at three corner regions, while an alignment mark 22 is provided in a fourth corner. Contact pads 26 are utilized for connecting by vias (not shown) to the metal 1 and metal 2 layers (not shown), respectively. A more detailed enlarged view of the stress test pattern is shown in FIG. 3.

Figure 3:
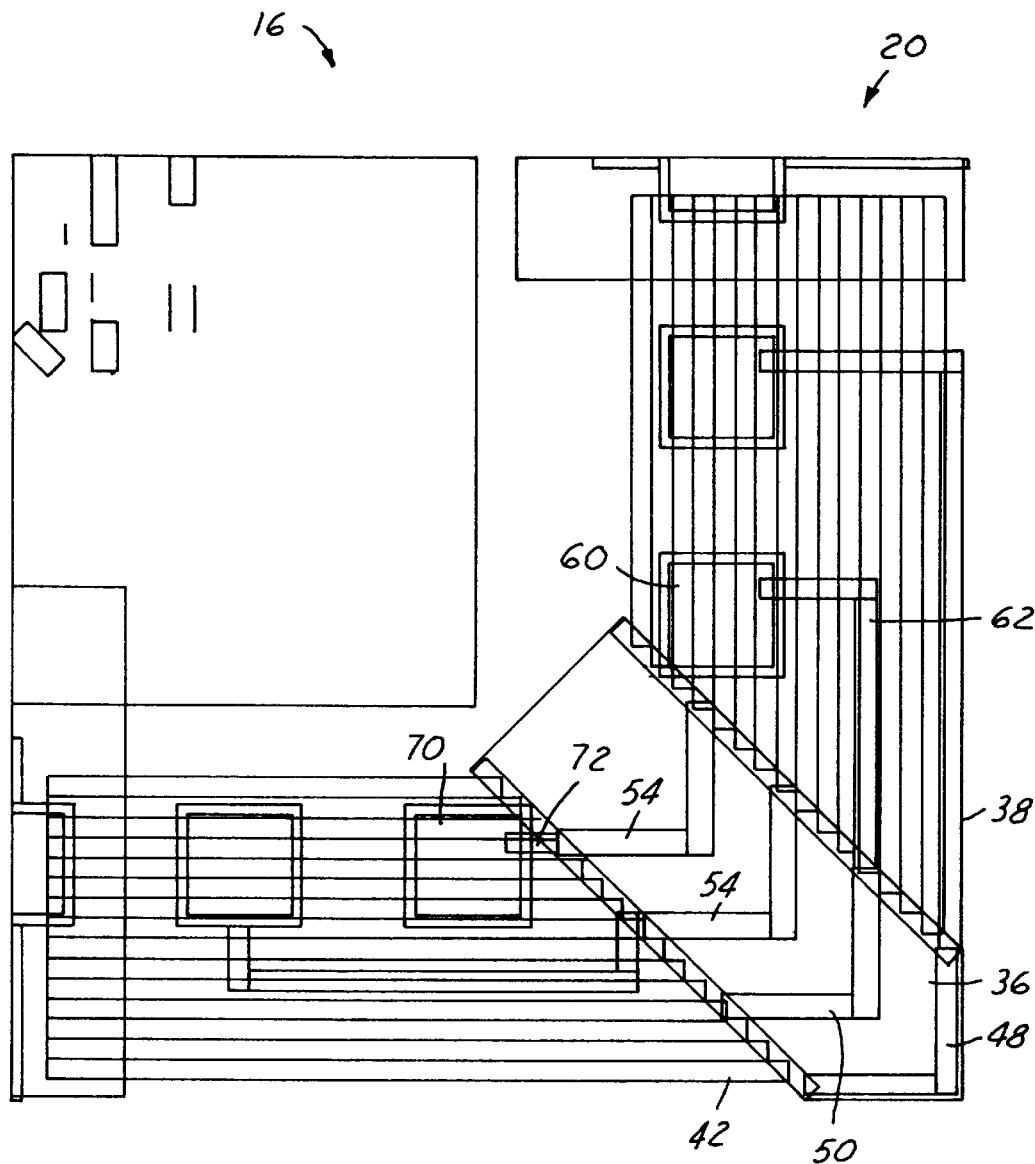
FIG. 3 is an enlarged, plane view of a stress test pattern showing the linear metal traces and the L-shaped metal bars that form the stress test pattern.
Figure 4:
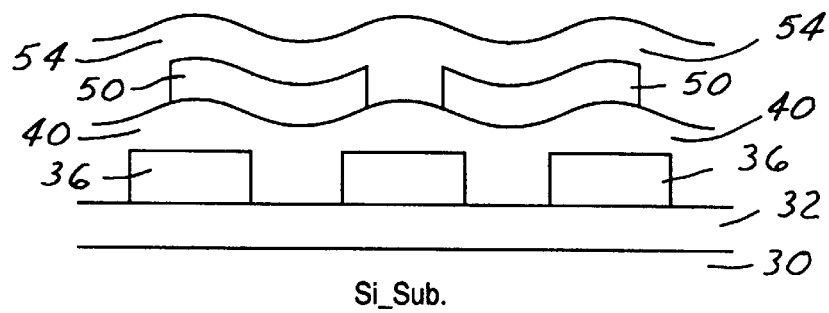

As shown in FIG. 3, an enlarged, plane view of the stress test pattern 20 provided on the IC die 16 is partially shown. The stress test pattern 20 is formed by a double metal method with an isolating layer in-between. The pattern 20 can be best described in conjunction with the enlarged, cross-sectional view of the pattern 20 shown in FIG. 4. On top of a silicon substrate 30, is first formed a thermal oxide layer 32 to a suitable thickness between about 1 $\mu$m and about 5 $\mu$m. This is shown in FIG. 4. A metal 1 layer (not shown) is then blanket deposited on top of the thermal oxide layer 32 and then formed in a photolithographic method into a plurality of diagonally positioned, linear metal traces 36. The diagonally formed metal traces 36 intersects the two sides 38,42 of the die 16 at a 45° angle. The metal 1 layer is normally deposited in a thickness between about 0.5 $\mu$m and about 10 $\mu$m, and preferably between about 1 $\mu$m and about 5 $\mu$m. For instance, a suitable thickness for the metal 1 layer may be about 1.2 $\mu$m.

On top of the photolithographically formed metal trace 36, is then deposited an isolation layer 40 of a dielectric material such as oxide or nitride. A suitable thickness for the isolation layer is between about 0.5 $\mu$m and about 10 $\mu$m, and preferably between about 1 $\mu$m and about 5 $\mu$m. The isolation layer 40 may be deposited by any suitable deposition method. One of such methods is a chemical vapor deposition technique. A wave-like surface of the isolation layer 40 is formed due to higher shrinkage at between the metal traces 36 of the larger thickness of the isolation layer.

On top of the isolation layer 40, is then blanket deposited a metal 2 layer (not shown) and then photolithographically formed into a second plurality of L-shaped metal bars 50. This is shown in both FIGS. 3 and 4. Similarly, other L-shaped metal bars 48,52 and 54 are formed in the same process by utilizing the same mask during the photolithographic and etching processes. As shown in FIG. 3, all four L-shaped metal bars form a 45° angle overlapping the linear, diagonally formed metal traces 36 which have a smaller width when compared to the L-shaped metal bars 48–54. Contact pads are connected to the L-shaped bars, for instance, contact pad 60 is electrically connected to the L-shaped metal bar 50 through a metal line 62 and a via (not shown). Contact pad 70 is electrically connected to the L-shaped metal bar 54 through metal line 72 and a via (not shown). The metal traces 36 are also connected to contact pads which are not shown in FIG. 3 for making probe testing with the contact pads 60,70 for determining resistance between the metal 1 and metal 2 layers when a current is flown through the isolation layer 40 (shown in FIG. 4).

Figure 7:
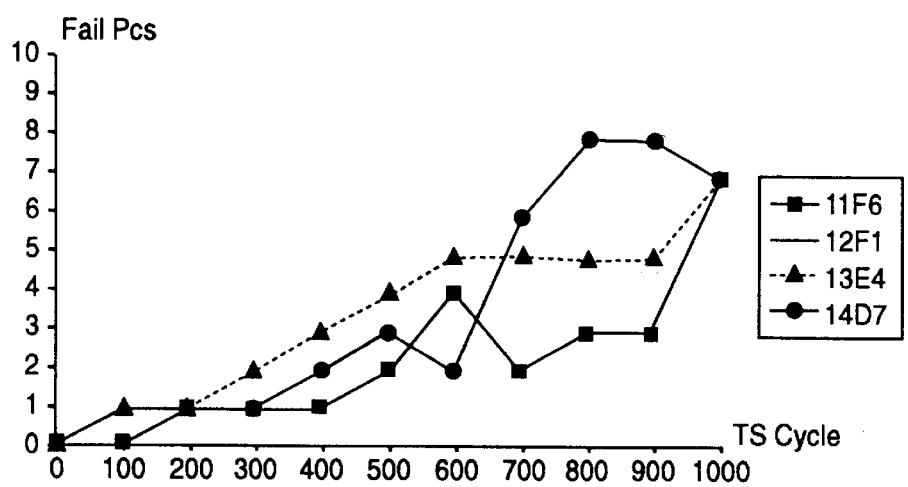
FIG. 7 is a graph illustrating the results obtained by using the present invention stress test pattern in a graph of failed pieces plotted against the number of thermal cycles.
Figure 5A:
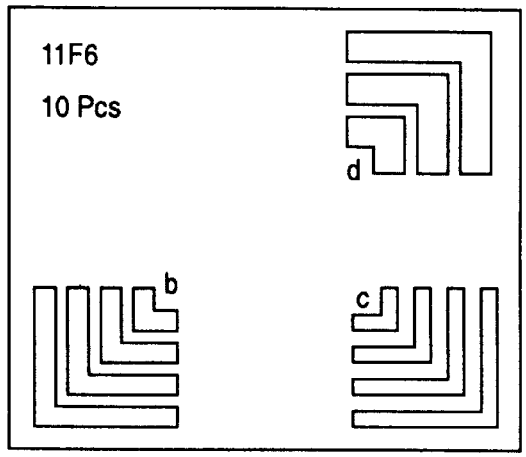
FIGS. 5 A,B,C and D illustrate a present invention stress test pattern that was prepared under different overetching conditions and different thicknesses of the isolation layer between the metal 1 and metal 2 layers.
Figure 5B:
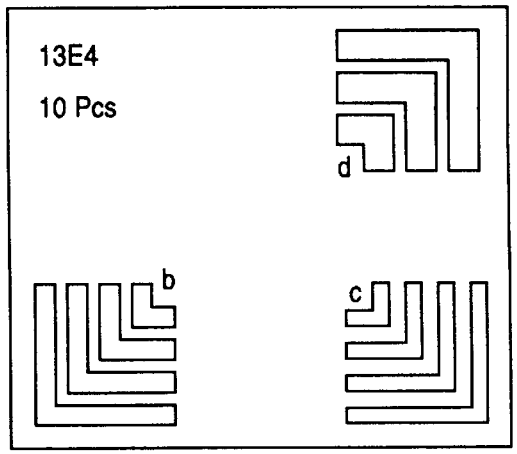
Figure 5C:
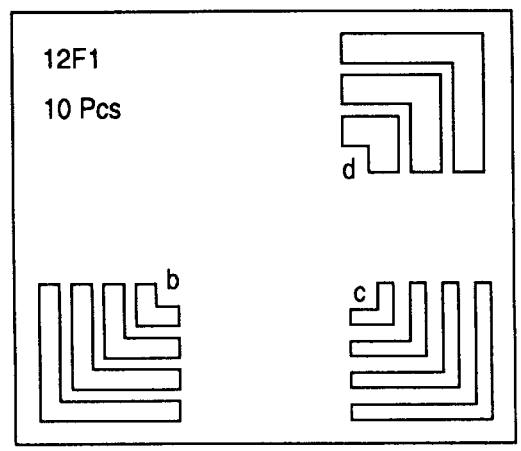
Figure 5D:
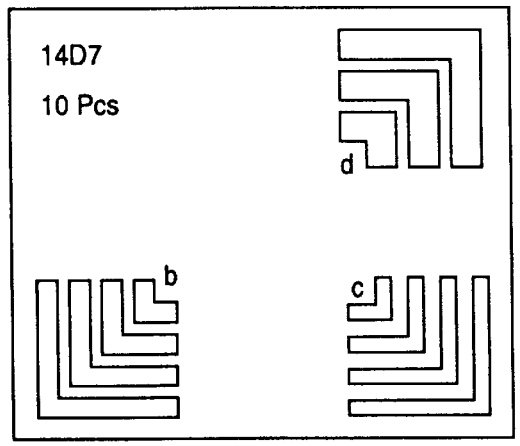

The desirable results obtained by utilizing the present invention novel stress test pattern are shown in FIGS. 5 A,B,C and D. FIGS. 5 A and B each illustrates three different stress test patterns arranged at different corner regions of the IC die, i.e., patterns b,c and d. As shown in FIGS. 5 A and B, for pattern b, the width of the L-shaped metal bars is 50, $\mu$m with a spacing of 30 $\mu$m between the bars; for pattern c, the width of the L-shaped metal bars is 25 $\mu$m with a spacing of 55 $\mu$m; and for pattern d, a width of 70 $\mu$m with a spacing of 10 $\mu$m. The data in FIG. 5A is obtained on IC dies with an 8,000 angstrom thickness isolation layer and 40 seconds overetching time. The data in FIG. 5B is obtained on test dies with a 9,000 angstrom thickness isolation layer and an overetching time of 40 seconds. Similarly, the data shown in FIG. 5C is obtained on test dies with an 8,000 angstrom thickness isolation layer and 50 seconds overetching time; for FIG. 5D, the test dies has a 9,000 angstrom thickness isolation layer and 50 seconds overetching time. The number of failed pieces are plotted against the number of thermal cycles for data of FIG. 5A in FIG. 7. It is seen, that in general, the failed pieces increase as the number of thermal shock cycles increase.

Figure 6A:
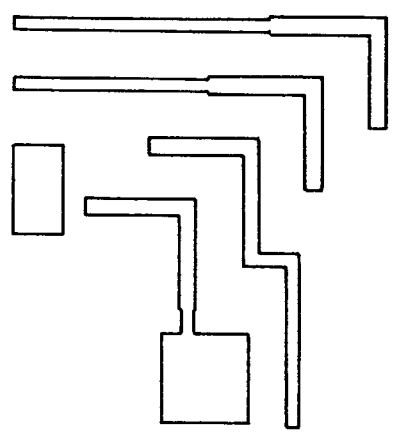
FIGS. 6 A, B and C illustrate other possible variations for the present invention stress test pattern with contact pads connected thereto.
Figure 6B:
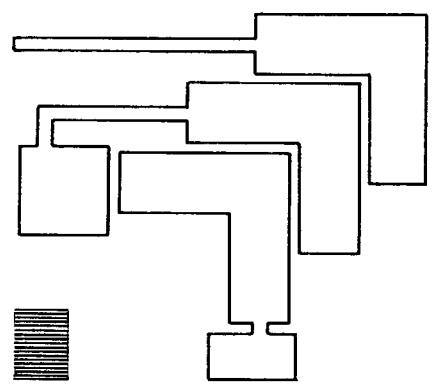
Figure 6C:
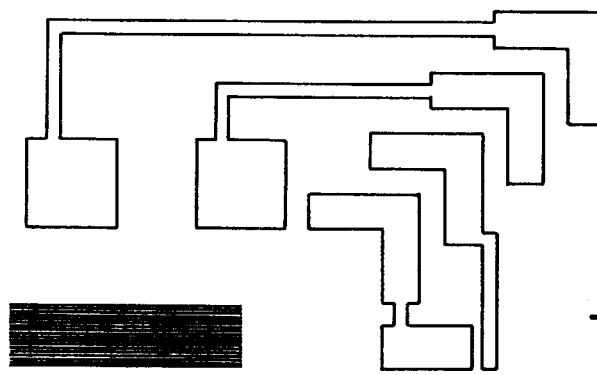

It should be noted that, in FIGS. 5 A–D, the three stress test patterns b,c and d are shown as illustrations only. Other possible variations for the present invention stress test patterns complete with probe pads are shown in FIGS. 6 A,B and C. Any suitable patterns may be selected to suit a specific geometry of the IC die or to achieve measurements of different parameters.

The present invention novel stress test pattern for IC dies and a method for forming the pattern have therefore been amply described in the above descriptions and in the appended drawings of FIGS. 1–7.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. An IC die formed with built-in stress test pattern comprising:
   a silicon substrate having four corner regions; and
   at least two stress test patterns each formed at one of said four corner regions, said at least two stress test patterns each comprises:
   a dielectric material layer on said silicon substrate;
   a first plurality of diagonally positioned linear metal traces formed of a first metal;
   an electrically insulating material layer on top of said first plurality of diagonally positioned metal traces; and
   a second plurality of L-shaped metal bars formed of a second metal positioned with the two sides of L parallel to the two sides of a corner region and overlapping said first plurality of metal traces with said electrically insulating material layer therein between.

2. An IC die formed with built-in stress test pattern according to claim 1, wherein each of said second plurality of L-shaped metal bars being electrically connected to a contact pad adapted for contact probing.

3. An IC die formed with built-in stress test pattern according to claim 1, wherein said at least two stress test patterns comprises three stress test patterns formed at three of said four corner regions.

4. An IC die formed with built-in stress test pattern according to claim 3, further comprising alignment marks formed at a fourth corner region.

5. An IC die formed with built-in test pattern according to claim 1, wherein said IC die being one of a multiplicity of IC dies formed on a silicon wafer.

6. An IC die formed with built-in test pattern according to claim 1, wherein said second plurality of L-shaped metal bars comprises between about 2 and about 10 metal bars.

7. An IC die formed with built-in test pattern according to claim 1, wherein said second plurality of L-shaped metal bars comprises preferably between about 3 and about 5 metal bars.

8. An IC die formed with built-in test pattern according to claim 1, wherein said second plurality of L-shaped metal bars are arranged parallel to each other.

9. An IC die formed with built-in test pattern according to claim 1, wherein said second plurality of L-shaped metal bars overlaps said first plurality of linear metal traces in such a way that the two sides of L each intersects said linear metal traces at 45° angle as viewed from the top of the IC die.

10. An IC die formed with built-in test pattern according to claim 1, wherein said first metal and said second metal are aluminum or aluminum alloy.

11. An IC die formed with built-in test pattern according to claim 1, further comprising a molding compound on top of the IC die encapsulating said second plurality of L-shaped metal bars.

* * * * *